(12) United States Patent
Scilla et al.

(10) Patent No.: US 8,525,579 B2
(45) Date of Patent: Sep. 3, 2013

(54) ELECTRONIC TRIMMING CIRCUIT WITH REDUCED NUMBER OF DEDICATED TRIMMING PINS

(75) Inventors: Giuseppe Scilla, Catania (IT); Francesco Distefano, Palagonia (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 13/470,760

(22) Filed: May 14, 2012

(65) Prior Publication Data
US 2012/0293241 A1 Nov. 22, 2012

(30) Foreign Application Priority Data
May 18, 2011 (IT) .............................. MI2011A0880

(51) Int. Cl.
*H01H 37/76* (2006.01)
(52) U.S. Cl.
USPC ......................................................... 327/525
(58) Field of Classification Search
USPC .......................................... 327/512, 524, 525
See application file for complete search history.

(56) References Cited

U.S. PATENT DOCUMENTS

| 4,064,493 A | 12/1977 | Davis | |
|---|---|---|---|
| 8,350,264 B2 * | 1/2013 | Li et al. | ........................... 257/50 |
| 2008/0036032 A1 | 2/2008 | Nonami | |
| 2012/0176180 A1 * | 7/2012 | Saed et al. | ..................... 327/525 |

OTHER PUBLICATIONS

Kawhaty et al., Electrically Adjustable, Integrated Passive Resistor, IBM Technical Disclosure Bulletin, International Business Machines Corp, (Thornwood), US, vol. 23, No. 11, Apr. 1, 1981, pp. 5049-5050.

* cited by examiner

*Primary Examiner* — Jeffrey Zweizig
(74) *Attorney, Agent, or Firm* — Allen, Dyer, Doppelt, Milbrath & Gilchrist, P.A.

(57) ABSTRACT

An electronic trimming circuit carries out a trimming operation on portions of an integrated device. The circuit includes N trimmable interconnected resistances, each connected in parallel to a respective shunt fuse. N trimming transistors are each connected to a respective one of the shunt fuses to force therethrough substantially the whole current flowing in the respective trimming transistor. N bias networks are each functionally connected to a control terminal of a respective one of the trimming transistors to directly bias an active junction thereof. An externally driven heating device is thermally coupled with the active junctions of the trimming transistors adapted to raise the temperature thereof.

22 Claims, 3 Drawing Sheets

ELECTRONIC TRIMMING CIRCUIT WITH REDUCED NUMBER OF DEDICATED TRIMMING PINS

FIELD OF THE INVENTION

The invention relates to electronic trimming of integrated circuits and more particularly to a circuit for carrying out a trimming operation on circuit portions of integrated circuits, having a reduced number of dedicated pins for the trimming operation.

BACKGROUND OF THE INVENTION

When a high accuracy level is required, dedicated trim circuitry may be realized in an integrated circuit for allowing modification of certain electrical parameters at the integrated circuit testing stage. This operation is commonly referred to as trimming. These parameter modifications are usually performed at a wafer testing stage. Integrated circuits are fabricated on wafers of semiconductor material, and an electrical wafer sort (EWS) test is conducted on the wafer prior to severing the individual integrated circuit dices destined to final packaging operations.

Trimming may even need to be carried out at the packaged circuit device final testing stage. Indeed, the isolating resin injected into the mold exerts a pressure on the semiconductor chip that may cause mechanical stress/strain on the crystalline semiconductor capable of altering electrical parameters. For this reason, it may be necessary to carry out a trimming operation when the packaged circuit device is tested.

An example of a functional circuit device that may require a trimming at a very late stage of the fabrication process is a band-gap regulator for producing a constant voltage reference insensitive to the working temperature. Regulators of this type are present in numerous system-on-chip devices, as those present in cellular telephones, data communication devices and most battery powered portable sets. At least two low-drop linear regulators are generally provided in such apparatuses made to comply with stringent specifications, especially in connection with their operating accuracy when temperature, supply voltage, and other parameters vary.

It is for these stringent reasons of ensuring accuracy of operation under varying conditions that a trimming operation may be carried out on the regulator circuit after completion of the packaging of the integrated circuit device that incorporates it.

A prior technique, rarely implemented, includes using strips of appropriate material (commonly Cr—Si) connected between two pins of the integrated circuit device and forcing a current through the strip to permanently modify the resistance of the strip and fix the output voltage to be compensated.

According to another technique, a band-gap voltage generator is equipped with a logic circuit or a memory programmed by burning fuses or ZAP Zener diodes, that act/configure circuit elements (for example, MOS transistors) of the band-gap generator such to fix the generated reference voltage. This trimming technique has the advantage of being implementable with a reduced number of pins, but requires a relatively complex logic circuitry that occupies a relevant silicon area.

A conventional trimming circuit is schematically shown in FIG. 1. The trimming circuit 1 is not complex and it is substantially a dipole comprising a first resistor R1 connected between a terminal A and a terminal B. A series of a second resistor R2 and of a ZAP Zener diode are connected in parallel to the first resistor R1. ZAP Zener diodes behave as an open circuit until the voltage across them exceeds a predetermined threshold value, typically 7V for a component fabricated by a third-generation BCD process. When this threshold is exceeded and a relatively large current (for example 250 mA) is being forced through the diode, the ZAP Zener diode changes its electrical characteristic permanently and becomes a resistive component of few Ohms (short-circuit).

FIG. 2 shows substantially the same structure as in FIG. 1, but a fuse FUSE is provided in place of the ZAP Zener diode. The operation of the trimming circuit shown in FIG. 2 is similar to that of the circuit in FIG. 1. In this case, the fuse would only be opened (burnt) by a current larger than a predetermined value.

The approach shown in FIG. 1 is the one that is generally adopted for BCD processes, because it provides more reliable performance over time and allows the outcome of the trimming operation to be monitored by externally short-circuiting the terminals C and D before carrying out the trimming.

Although quite popular, the conventional approaches of FIGS. 1 and 2 require N+1 dedicated pins for trimming N ZAP Zener diodes or fuses. A trimming circuit adapted to be used with any kind of circuit device to be trimmed after packaging it, offering the same advantages of classic trimming circuits of FIGS. 1 and 2 though requiring a reduced number of dedicated pins for carrying out the trimming step, is highly desirable.

SUMMARY OF THE INVENTION

A trimming circuit having a reduced number of components and requiring at most three additional pins independently from the number of fuses of the circuit is provided. As with typical trimming circuits, the present trimming circuit comprises N trimmable interconnected resistances, each resistance being connected in parallel to a respective fuse.

Differently from prior art trimming circuits, the present trimming circuit allows to burn any number of fuses according to a fixed trimming sequence using a reduced number of dedicated pins because it comprises N trimming transistors each connected to a respective shunt fuse to force therethrough substantially the whole current flowing through the trimming transistor. N bias networks are each functionally connected to a control terminal of a respective one of the trimming transistors to directly bias an active junction thereof. An externally driven heating circuit is thermally coupled with the active junctions of the trimming transistors and adapted to raise the temperature thereof.

According to a present method of trimming functional circuits of an integrated circuit device using the present trimming circuit of this disclosure, the active junctions of the trimming transistors are preferably biased with different direct voltages, the trimming transistors connected to the fuses that should be burnt first in a trimming sequence being biased with a higher direct voltage than the trimming transistors connected to fuses that should be burnt successively in the sequence. By driving the heating circuit, the working temperature of the active junctions increases and thus also the current forced by the trimming transistors through the fuses increases, until the fuses burn.

Therefore, by fixing the working temperature of the trimming transistors it is possible to fix the number of fuses to be burnt according to the trimming sequence.

DETAILED DESCRIPTION OF THE PREFERRED EMBODIMENTS

Figure 1:
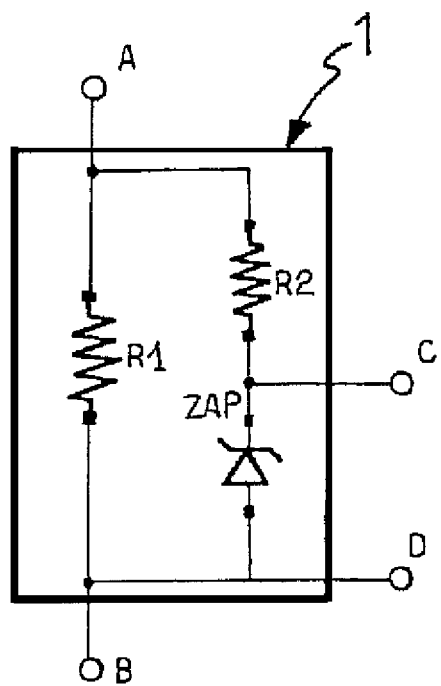
FIG. 1 is a schematic diagram illustrating a trimming circuit according to the prior art including a ZAP Zener diode.
Figure 2:
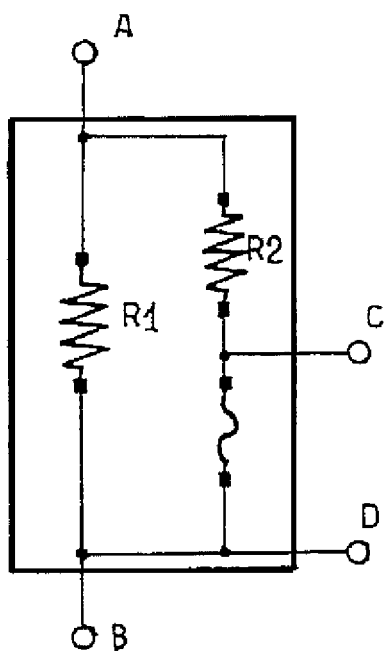
FIG. 2 is a schematic diagram illustrating another trimming circuit of the prior art including a fuse.
Figure 3:
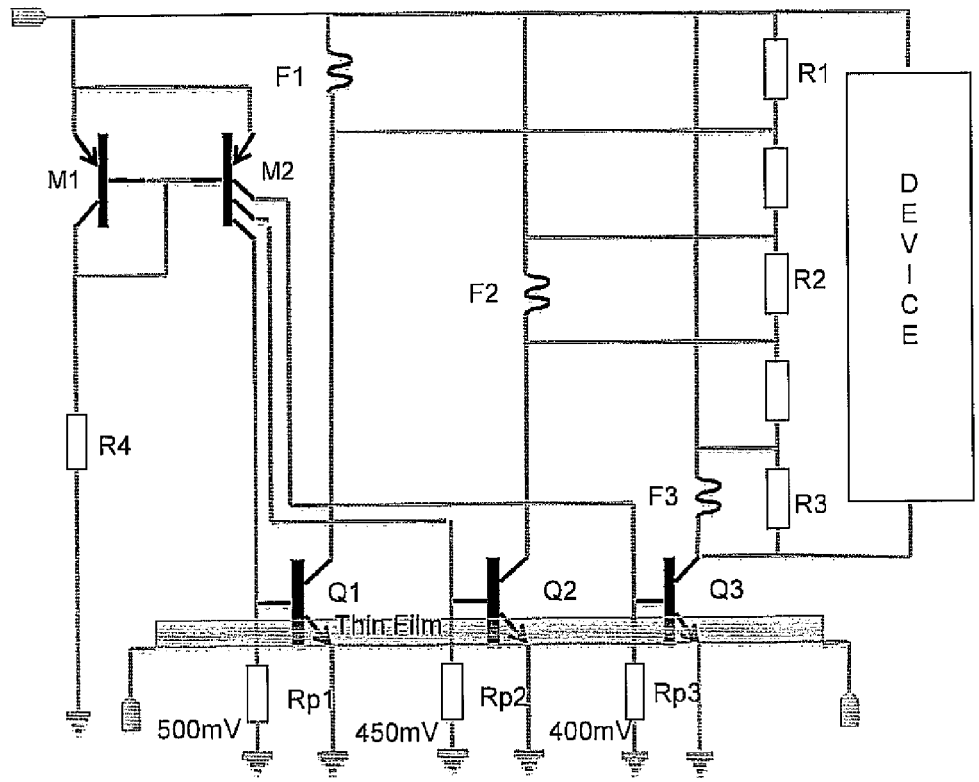
FIG. 3 is a schematic diagram illustrating a trimming circuit according to a present embodiment with three fuses to be trimmed.

An exemplary embodiment of the present electronic trimming circuit is shown in FIG. 3. The present trimming circuit may be incorporated into any integrated circuit device having portions that require trimming. For example, the trimming circuit could be used in combination with a conventional generator of a band-gap voltage.

The trimming circuit of FIG. 3 has a number N (in the exemplary case of FIG. 3, N=3) of fuses Fi each connected in parallel to a trimming resistance Ri. Typically, the trimming resistances Ri are portions of the body resistance of the integrated circuit device to be trimmed and are shorted unless the respective fuses are burnt. A plurality of N trimming transistors Qi, having base-emitter resistors Rpi, are connected to the respective fuses Fi such to force throughout the fuses substantially the whole current flowing through the respective trimming transistors. An input current mirror M1-M2 forces a current throughout the base-emitter resistors Rpi such to bias the trimming transistors Qi with respective bias base-emitter voltages $V_{BEi}$.

An externally driven heating circuit or device, such as for example a strip of resistive material connected between two dedicated trimming pins, is thermally coupled with active junctions (the base-emitter junctions, in the bias conditions illustrated in the figure) of the trimming transistors and are adapted to raise the temperature thereof. For example, the heating device may be a metal strip or a thin film deposited during a layout phase on the base-emitter junctions of the trimming transistors Qi. By heating the heating device, the temperature of the active junctions also increases. In the shown embodiment, by forcing a current through the resistive strip it is possible to fix the operating temperature of the trimming transistors Qi and thus to burn fuses, as will be explained hereafter.

Figure 4:
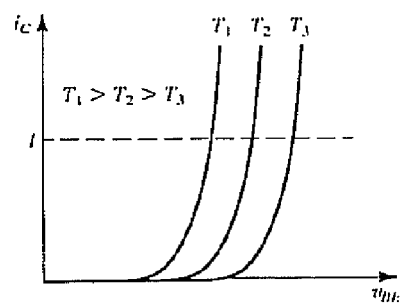
FIG. 4 is an exemplary graph of base-emitter voltage vs. collector current characteristics of BJTs at different temperatures for the circuit of FIG. 3.

When the operating temperature increases a same collector current I may be obtained with a smaller base-emitter voltage as shown in the exemplary graph of FIG. 4 of the base-emitter voltage $V_{BE}$ vs. collector current $I_c$ of a BJT. Typically, the base-emitter voltage reduces by 2 mV per each degree of increment of the operating temperature. Therefore, if the base-emitter voltage is kept constant, by increasing the working temperature the collector current may increase rapidly. This characteristic is exploited by the present trimming circuit for burning a desired number of fuses according to a pre-established trimming sequence.

According to an embodiment, all trimming transistors Qi may be identical with each other and are connected to different base-emitter resistors Rpi. The input current mirror forces a same current through all the base-emitter resistors, thus the bias base-emitter voltages of the trimming transistors Qi are different among them. When a current is forced through the resistive strip, the active junctions of the trimming transistors Qi heat up and thus the collector currents increase rapidly as far as the respective fuses are burnt.

If all the trimming transistors Qi are identical, the fuse that will burn first is the fuse connected to the trimming transistor biased with the highest direct base-emitter voltage, then the fuse connected to the trimming transistor biased with the second highest base-emitter voltage will burn and so on. Preferably, the threshold voltages of the trimming transistors Qi at room temperature are greater than the bias base-emitter voltages such to keep the transistors Qi off when no trimming operation is to be performed.

With the present trimming circuit as shown in FIG. 3, it is possible to establish the trimming sequence of the fuses by fixing the values of the base-emitter resistors Rpi and, by forcing an appropriate current throughout the resistive strip, it is possible to establish the temperature of the active junctions of all the trimming transistors and thus the fuses to be burnt.

In practice, the trimming transistors operate as temperature-controlled current generators with different temperature-current characteristics, that in general are adapted to generate different currents at a same temperature. By increasing the temperature of all the temperature-controlled current generators, different currents are forced throughout the fuses until they burn according to the desired trimming sequence. The fuses are preferably identical among them, thus the trimming sequence is established when the bias networks of the trimming transistors, that in the shown example are base-emitter resistances biased by an input current mirror, are fabricated.

To have a trimming sequence and not to burn all the fuses at the same time, if all trimming transistors are identical to each other, the base-emitter resistors of the trimming transistors should have a value chosen at least between two possible values.

In the exemplary embodiment of FIG. 3 the input current mirror forces a same current through all the base-emitter resistors using an output transistor with partitioned collector. As an alternative, the input current mirror may comprise a plurality of output transistors each forcing a same current to a respective base-emitter resistor.

Figure 5:
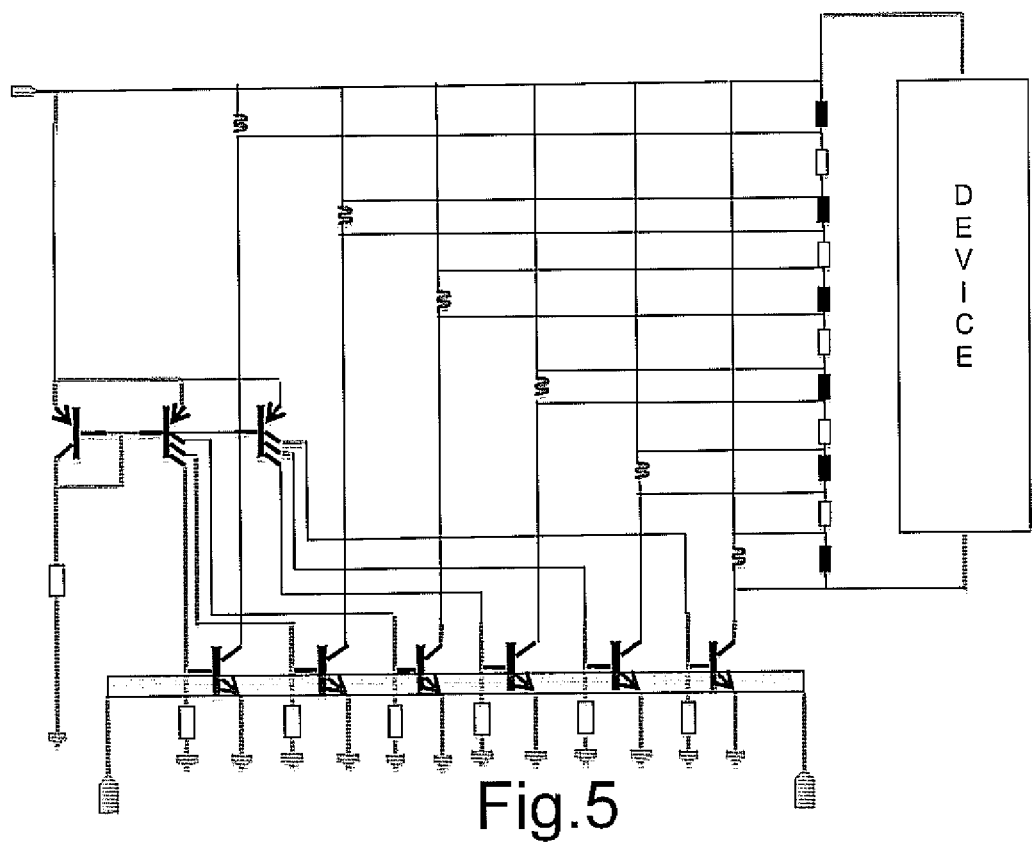
FIG. 5 is a schematic diagram illustrating a trimming circuit according to a present embodiment with numerous fuses to be trimmed.

According to yet another alternative, depicted in FIG. 5, the input current mirror may comprise a plurality of output transistors with partitioned collector for forcing a same current through all the base-emitter resistors. The trimming transistors may advantageously be identical among them and have a especially reduced area, provided that they are capable of supplying a current sufficient to burn the respective fuse.

According to yet another embodiment, different bias base-emitter voltages of the trimming transistors are obtained by realizing identical base-emitter resistors and making the input current mirror force different currents therethrough. This may be realized for example with an input current mirror having a plurality of output transistors of different sectional area, each forcing a different current throughout the respective base-emitter resistor.

According to yet another embodiment, the trimming transistors have different threshold voltages and are all biased with the same base-emitter voltage.

The herein proposed trimming circuits are particularly advantageous because they may be fabricated without implementing additional process steps and need only three dedicated pins for all trimming steps independently from the number of fuses to be burnt.

The present trimming circuits allow to trim any circuit device, even after the packaging stage, with a great accuracy and with results that are stable during the functioning life of the circuit device. Moreover they may be realized in any BJT or MOS technology, use only low-cost components and do not need any dedicated logic circuitry as in similar prior circuits, that cause a relevant silicon area consumption.

That which is claimed:

1. An electronic trimming circuit configured to perform a trimming operation on portions of an integrated device, comprising:
   N shunt fuses;
   N trimmable interconnected resistances each coupled in parallel to a respective shunt fuse;
   N trimming transistors each coupled to a respective shunt fuse and configured to force therethrough substantially the whole current flowing in the respective trimming transistor;
   N bias networks each coupled to a control terminal of a respective trimming transistor to bias an active junction thereof; and
   a heating device thermally coupled with the active junctions of the trimming transistors and configured to raise the temperature thereof.

2. The electronic trimming circuit of claim 1, wherein said N bias networks comprise:
   N bias resistors each coupled to the control terminal of a respective trimming transistor; and
   an input current mirror coupled to each of said N bias resistors and configured to bias the control terminals of said trimming transistors.

3. The electronic trimming circuit of claim 2, wherein:
   said trimming transistors are identical;
   said bias resistors have respective values chosen from at least two values; and
   said input current mirror is configured to force a matching current in each of said bias resistors.

4. The electronic trimming circuit of claim 2, wherein said input current mirror includes an output transistor having a partitioned collector coupled to a subset of said bias resistors to force a current therethrough.

5. The electronic trimming circuit of claim 2, wherein said input current mirror includes a plurality of output transistors having partitioned collectors each coupled to a respective subset of said bias resistors to force a current therethrough.

6. The electronic trimming circuit of claim 2, wherein each of said trimming transistors comprises a bipolar-junction-transistor (BJT) and each of said bias resistors comprises a base-emitter resistor.

7. The electronic trimming circuit of claim 1, wherein said heating device comprises a plurality of trimming terminals, and a strip of resistive material connected between said plurality of trimming terminals.

8. The electronic trimming circuit of claim 7, wherein said strip of resistive material comprises at least one of a metal strip and a thin film coupled over the active junctions of the trimming transistors.

9. An electronic trimming circuit of an integrated device comprising:
   a plurality of shunt fuses;
   a plurality of interconnected resistances each coupled in parallel to a respective shunt fuse;
   a plurality of trimming transistors each coupled to a respective shunt fuse;
   a plurality of bias networks each coupled to a control terminal of a respective trimming transistor to bias an active junction thereof; and
   a heating device thermally coupled with the active junctions of the trimming transistors.

10. The electronic trimming circuit of claim 9, wherein said bias networks comprise:
    a plurality of bias resistors each coupled to the control terminal of a respective trimming transistor; and
    an input current mirror coupled to each of said bias resistors.

11. The electronic trimming circuit of claim 10, wherein said trimming transistors are alike and said input current mirror is configured to force a matching current in each of said bias resistors.

12. The electronic trimming circuit of claim 10, wherein said input current mirror includes an output transistor having a partitioned collector coupled to a subset of said bias resistors to force a current therethrough.

13. The electronic trimming circuit of claim 10, wherein said input current mirror includes a plurality of output transistors having partitioned collectors each coupled to a respective subset of said bias resistors to force a current therethrough.

14. The electronic trimming circuit of claim 10, wherein each of said trimming transistors comprises a bipolar-junction-transistor (BJT) and each of said bias resistors comprises a base-emitter resistor.

15. The electronic trimming circuit of claim 9, wherein said heating device comprises a plurality of trimming terminals, and a strip of resistive material connected between the plurality of trimming terminals.

16. A method of trimming portions of an integrated circuit device with a trimming circuit including a plurality of interconnected trimmable resistances each coupled in parallel to a respective shunt fuse, a plurality of trimming transistors each connected to a respective shunt fuse to force a current flowing through the respective trimming transistor through the shunt fuse, a plurality of bias networks each coupled to a control terminal of a respective trimming transistor to bias an active junction thereof, and a heating device thermally coupled with the active junctions of the trimming transistors to raise the temperature thereof, the method comprising:
    biasing, with a relatively higher voltage, the active junctions of the trimming transistors connected to shunt fuses to be burnt first and, with a relatively lower voltage, the active junctions of the trimming transistors connected to shunt fuses to be burnt in turn according to a trimming sequence; and
    driving the heating device to raise the temperature of the active junctions of the trimming transistors.

17. The method of claim 16, wherein said bias networks comprise:
    a plurality of bias resistors each coupled to the control terminal of a respective trimming transistor; and
    an input current mirror coupled to each of the bias resistors.

18. The method of claim 17, wherein the trimming transistors are alike and said input current mirror is configured to force a matching current in each of the bias resistors.

19. The method of claim 17, wherein the input current mirror includes an output transistor having a partitioned collector coupled to a subset of the bias resistors to force a current therethrough.

20. The method of claim 17, wherein the input current mirror includes a plurality of output transistors having partitioned collectors each coupled to a respective subset of the bias resistors to force a current therethrough.

21. The method of claim 17, wherein each of the trimming transistors comprises a bipolar-junction-transistor (BJT) and each of the bias resistors comprises a base-emitter resistor.

22. The electronic trimming circuit of claim 16, wherein the heating device comprises a plurality of trimming terminals, and a strip of resistive material connected between the trimming terminals.

* * * * *